(12) United States Patent
Lee et al.

(10) Patent No.: US 11,835,586 B2
(45) Date of Patent: Dec. 5, 2023

(54) BATTERY MANAGEMENT APPARATUS AND METHOD

(71) Applicant: LG ENERGY SOLUTION, LTD., Seoul (KR)

(72) Inventors: Dong-Chun Lee, Daejeon (KR); Hyo-Seong An, Daejeon (KR); Seog-Jin Yoon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 23 days.

(21) Appl. No.: 17/608,794

(22) PCT Filed: Dec. 30, 2020

(86) PCT No.: PCT/KR2020/019454
§ 371 (c)(1),
(2) Date: Nov. 4, 2021

(87) PCT Pub. No.: WO2021/137642
PCT Pub. Date: Jul. 8, 2021

(65) Prior Publication Data
US 2022/0317194 A1  Oct. 6, 2022

(30) Foreign Application Priority Data
Jan. 2, 2020  (KR) ........................ 10-2020-0000395

(51) Int. Cl.
*G01R 31/3842* (2019.01)
*G01R 31/36* (2020.01)
(Continued)

(52) U.S. Cl.
CPC ..... *G01R 31/3842* (2019.01); *G01R 31/3648* (2013.01); *H01M 10/425* (2013.01); *H01M 10/482* (2013.01); *H01M 2010/4271* (2013.01)

(58) Field of Classification Search
CPC ............ G01R 31/3842; G01R 31/3648; G01R 31/3828; G01R 31/388; H01M 10/425;
(Continued)

(56) References Cited

U.S. PATENT DOCUMENTS

2009/0099799 A1* 4/2009 Barsoukov ........... G01R 31/382
702/63
2011/0174282 A1 7/2011 Maruyama et al.
(Continued)

FOREIGN PATENT DOCUMENTS

CN  103956791 A  7/2014
CN  105048484 A  11/2015
(Continued)

OTHER PUBLICATIONS

European Search Report issued in EP 20909782.3, dated Sep. 28, 2022.
(Continued)

*Primary Examiner* — Michael P Nghiem
(74) *Attorney, Agent, or Firm* — Birch, Stewart, Kolasch & Birch, LLP (57) ABSTRACT

A battery management apparatus according to an embodiment of the present disclosure includes a voltage measurer for measuring a voltage of a battery module and output a measured voltage value; a current measurer for measuring a charging current of the battery module and output a measured current value; and a controller for receiving the measured voltage value and the measured current value, estimating a state of charge (SOC) of the battery module based on the measured voltage value and the measured current value, calculating an accumulated change rate by adding up a change rate of the estimated SOC per unit time,
(Continued)

and detecting whether the battery module has a defect by comparing the calculated accumulated change rate with a reference change rate.

9 Claims, 6 Drawing Sheets

(51) Int. Cl.
   *H01M 10/42* (2006.01)
   *H01M 10/48* (2006.01)
(58) Field of Classification Search
   CPC ............... H01M 10/482; H01M 10/48; H01M 2010/4271
   USPC .......................................................... 702/63
   See application file for complete search history.

(56) References Cited

U.S. PATENT DOCUMENTS

| | | |
|---|---|---|
| 2011/0254559 A1 | 10/2011 | Nakashima et al. |
| 2013/0093383 A1 | 4/2013 | Kim et al. |
| 2014/0184234 A1 | 7/2014 | Okabe |
| 2015/0268309 A1* | 9/2015 | Kim ..................... G01R 31/392 324/432 |
| 2015/0355286 A1 | 12/2015 | Kobayashi et al. |
| 2016/0089999 A1 | 3/2016 | Tabatowski-Bush et al. |
| 2016/0218540 A1 | 7/2016 | Zhou et al. |
| 2017/0144563 A1 | 5/2017 | Lim et al. |
| 2017/0201103 A1 | 7/2017 | Jeon et al. |
| 2017/0259687 A1* | 9/2017 | Chikkannanavar .......................... H02J 7/00308 |
| 2018/0136283 A1 | 5/2018 | Song et al. |
| 2018/0299511 A1 | 10/2018 | Kim |
| 2021/0086661 A1* | 3/2021 | Furukawa ........... H01M 10/482 |
| 2022/0317192 A1* | 10/2022 | Lee ....................... H02J 7/0048 |

FOREIGN PATENT DOCUMENTS

| | | |
|---|---|---|
| CN | 105471020 A | 4/2016 |
| CN | 107031426 A | 8/2017 |
| JP | 2007-240308 A | 9/2007 |
| JP | 2007-327772 A | 12/2007 |
| JP | 2009-42071 A | 2/2009 |
| JP | 2011-144785 A | 7/2011 |
| JP | 5896737 B2 | 4/2015 |
| JP | 2016-77054 A | 5/2016 |
| KR | 10-0911317 B1 | 8/2009 |
| KR | 10-2011-0139187 A | 12/2011 |
| KR | 10-2013-0040575 A | 4/2013 |
| KR | 10-2017-0084608 A | 7/2017 |
| KR | 10-2017-0109435 A | 9/2017 |
| KR | 10-2018-0055123 A | 6/2018 |
| KR | 10-2018-0116914 A | 10/2018 |
| WO | WO 2012/115393 A2 | 8/2012 |
| WO | WO 2014/115513 A1 | 7/2014 |
| WO | WO 2019/123907 A1 | 6/2019 |
| WO | WO-2019123907 A1 * | 6/2019 .............. B60L 58/12 |

OTHER PUBLICATIONS

International Search Report (PCT/ISA/210) issued in PCT/KR2020/019454, dated Apr. 26, 2021.

* cited by examiner

BATTERY MANAGEMENT APPARATUS AND METHOD

TECHNICAL FIELD

The present application claims priority to Korean Patent Application No. 10-2020-0000395 filed on Jan. 2, 2020 in the Republic of Korea, the disclosures of which are incorporated herein by reference.

The present disclosure relates to a battery management apparatus and method, and more particularly, to a battery management apparatus and method capable of detecting a defect of a battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

In general, a battery module in which a plurality of batteries are connected to each other is used depending on the purpose of use. For example, a battery module in which a plurality of batteries are connected in parallel may be used to increase the capacity, or a battery module in which a plurality of batteries are connected in series may be used to increase an output voltage.

Here, in the case of a battery module in which a plurality of batteries are connected in parallel, it is difficult in terms of cost and structure to monitor the batteries connected in parallel individually. In general, a battery module or a battery pack including the battery module has a structural feature that is easily disassembled or separated in order to increase stability against impact. Therefore, the battery module in which a plurality of batteries are connected in parallel has difficulty in detecting whether each battery has a defect.

In addition, if a plurality of battery modules are provided and there is a defect in some batteries included in some battery modules, damage may be applied to the battery, the battery module, and the battery pack by in-rush current generated by the difference in capacity between the plurality of battery modules.

DISCLOSURE

Technical Problem

The present disclosure is designed to solve the problems of the related art, and therefore the present disclosure is directed to providing a battery management apparatus and method, which may detect not only a defect of a battery module but also the number of abnormal cells included in the battery module.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery management apparatus, comprising: a voltage measurer configured to measure a voltage of a battery module and output a measured voltage value; a current measurer configured to measure a charging current of the battery module and output a measured current value; and a controller configured to receive the measured voltage value and the measured current value, estimate a state of charge (SOC) of the battery module based on the measured voltage value and the measured current value, calculate an accumulated change rate by adding up a change rate of the estimated SOC per unit time, and detect whether the battery module has a defect by comparing the calculated accumulated change rate with a reference change rate.

The battery module may include a plurality of battery cells connected in parallel.

The controller may be configured to detect a number of abnormal cells among the plurality of battery cells included in the battery module by comparing the calculated accumulated change rate with the reference change rate.

The controller may be configured to set a detection ratio according to the number of abnormal cells, based on the number of the plurality of battery cells, and detect the number of abnormal cells according to a result of comparing a difference between the calculated accumulated change rate and the reference change rate with the detection ratio.

The controller may be configured to detect the number of abnormal cells according to a value obtained by dividing the difference between the calculated accumulated change rate and the reference change rate by the detection ratio.

The controller may be configured to calculate the accumulated change rate by summing the change rate of the SOC per unit time from an accumulation start point to an accumulation end point during which the estimated SOC changes, and set the reference change rate by summing a change rate of a reference SOC from the accumulation start point to the accumulation end point.

The controller may be configured to determine a time point at which the measured voltage value becomes equal to or greater than a reference voltage value as the accumulation start point.

The controller may be configured to determine a time point at which the SOC of the battery module reaches a preset target value as the accumulation end point of the battery module.

The battery module includes a plurality of battery cells connected in parallel and may be provided in plural.

The controller may be configured to calculate an accumulated change rate of each of the plurality of battery modules and detect the number of abnormal cells among the plurality of battery cells included in each of the plurality of battery modules by comparing the accumulated change rate calculated for each of the plurality of battery modules with the reference change rate.

A battery pack according to another embodiment of the present disclosure may comprise the battery management apparatus according to an embodiment of the present disclosure.

A battery management method according to still another embodiment of the present disclosure may comprise a voltage measuring step of measuring a voltage of a battery module; a current measuring step of measuring a charging current of the battery module; a state of charge SOC estimating step of estimating a SOC of the battery module based on the measured voltage value and the measured current value; an accumulated change rate calculating step of calculating an accumulated change rate by adding up a change rate of the estimated SOC per unit time; and a defect detecting step of detecting whether the battery module has a defect by comparing the calculated accumulated change rate with a reference change rate.

Advantageous Effects

According to an aspect of the present disclosure, there is an advantage in that the battery management apparatus may detect a defect in a battery module including a plurality of battery cells connected in parallel by comparing an accumulated change rate for the battery module with a reference change rate for a reference module.

In addition, according to an aspect of the present disclosure, it is possible not only to detect a defect of the battery module but also to detect the number of abnormal cells included in the battery module. Therefore, there is an advantage in that more detailed information may be provided about the defect of the battery module.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
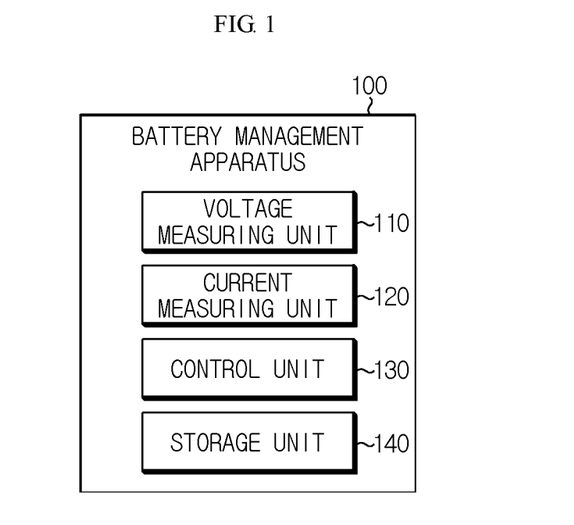
FIG. 1 is a diagram schematically showing a battery management apparatus according to an embodiment of the present disclosure.
Figure 2:
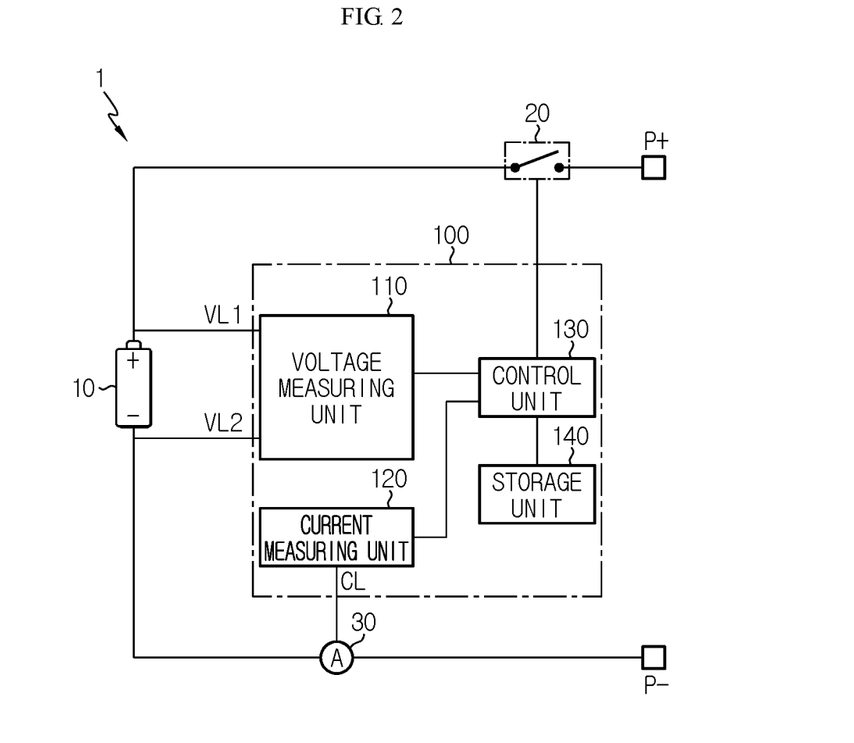
FIG. 2 is a diagram showing an exemplary configuration of a battery pack including the battery management apparatus according to an embodiment of the present disclosure.

FIG. 1 is a diagram schematically showing a battery management apparatus 100 according to an embodiment of the present disclosure. FIG. 2 is a diagram showing an exemplary configuration of a battery pack 1 including the battery management apparatus 100 according to an embodiment of the present disclosure.

Referring to FIG. 2, the battery management apparatus 100 according to an embodiment of the present disclosure may be provided to a battery pack 1. In addition, the battery pack 1 may include a battery module 10, a main relay 20, a current measuring element 30, and the battery management apparatus 100.

Here, one or more battery cells connected in series and/or in parallel may be included in the battery module 10. In addition, the battery cell means one independent cell that has a negative electrode terminal and a positive electrode terminal and is physically separable. For example, one lithium ion battery or one lithium polymer battery may be regarded as a battery cell.

Preferably, in the battery module 10, a plurality of battery cells may be connected in parallel. An exemplary configuration of the battery module 10 will be described with reference to FIG. 3.

Figure 3:
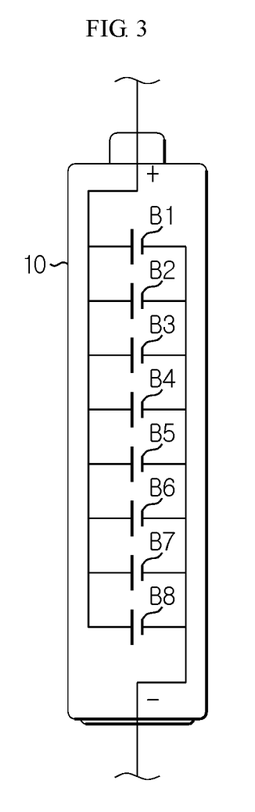
FIG. 3 is a diagram showing an exemplary configuration of a battery module included in the battery pack.

FIG. 3 is a diagram showing an exemplary configuration of the battery module 10 included in the battery pack 1. For example, as in the embodiment of FIG. 3, in the battery module 10, a plurality of battery cells B1 to B8 connected in parallel may be included. Hereinafter, it will be described that eight battery cells are connected in parallel in the battery module 10.

The main relay 20 may be provided between the battery module 10 and an electrode terminal P+, P− of the battery pack 1. That is, the main relay 20 may be disposed in a high current path through which a charging current and a discharging current of the battery module 10 flow. In addition, the high current path may be electrically connected or disconnected according to the operation state of the main relay 20.

For example, in the embodiment of FIG. 2, the main relay 20 may be disposed between a positive electrode terminal of the battery module 10 and the positive electrode terminal P+ of the battery pack 1. However, it should be understood that the arrangement position of the main relay 20 is not limited to the embodiment of FIG. 2. That is, in another embodiment, the main relay 20 may also be disposed between a negative electrode terminal of the battery module 10 and the negative electrode terminal P− of the battery pack 1.

Figure 4:
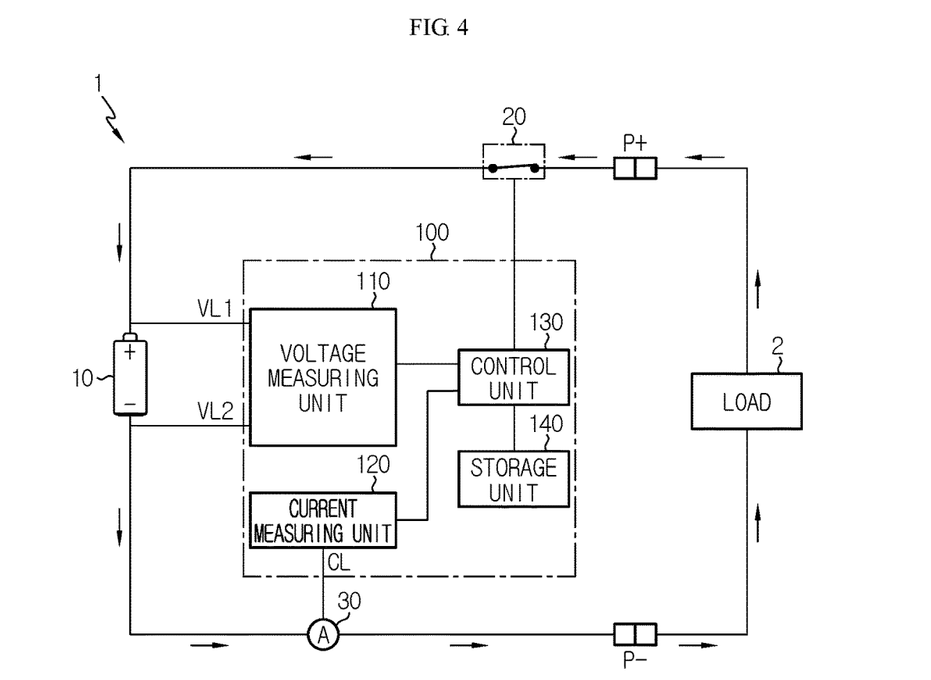
FIG. 4 is a diagram showing an exemplary configuration where a load is connected to the battery pack including the battery management apparatus according to an embodiment of the present disclosure.

FIG. 4 is a diagram showing an exemplary configuration where a load 2 is connected to the battery pack 1 including the battery management apparatus 100 according to an embodiment of the present disclosure.

For example, referring to FIG. 4, if the operation state of the main relay 20 is a turn-on state, the high current path may be electrically connected so that a charging current output from a load 2 flows into the battery module 10. At this time, the operation state of the main relay 20 may be controlled by a control unit 130.

Hereinafter, the battery management apparatus 100 will be described in detail with reference to the drawings.

Referring to FIG. 1, the battery management apparatus 100 may include a voltage measuring unit 110, a current measuring unit 120, a control unit 130, and a storage unit 140.

The voltage measuring unit 110 may be configured to measure a voltage of the battery module 10.

Specifically, the voltage measuring unit 110 may measure a positive electrode voltage and a negative electrode voltage of the battery module 10. In addition, the voltage measuring unit 110 may measure the voltage of the battery module 10 by calculating a potential difference between the measured positive electrode voltage and the measured negative electrode voltage of the battery module 10.

For example, in the embodiment of FIG. 4, the voltage measuring unit 110 may be connected to the battery module 10 through a first voltage sensing line VL1 and a second voltage sensing line VL2. Preferably, the first voltage sensing line VL1 may be connected to the positive electrode terminal of the battery module 10, and the second voltage sensing line VL2 may be connected to the negative electrode terminal of the battery module 10.

The voltage measuring unit 110 may be configured to output a measured voltage value.

Preferably, the voltage measuring unit 110 may be electrically connected to the control unit 130 to transmit and receive a signal to/from the control unit 130. For example, in the embodiment of FIG. 4, the voltage measuring unit 110 may be electrically connected to the control unit 130. In addition, the voltage measuring unit 110 may output the measured voltage value of the battery module 10 to the control unit 130.

The current measuring unit 120 may be configured to measure a charging current of the battery module 10.

Specifically, the current measuring unit 120 may be connected to the current measuring element 30 included in the battery pack 1 through a current sensing line CL. Here, the current measuring element 30 may be disposed on the high current path of the battery pack 1. For example, the current measuring element 30 may be a sense resistor or an ampere meter.

The current measuring unit 120 may be connected to the current measuring element 30 and measure the current of the battery module 10 by reading a value measured by the current measuring element 30.

For example, in the embodiment of FIG. 4, the current measuring unit 120 may be connected to the current measuring element 30 through the current sensing line CL to measure the charging current of the battery module 10.

The current measuring unit 120 may be configured to output a measured current value.

Like the voltage measuring unit 110, the current measuring unit 120 may be electrically connected to the control unit 130 to transmit and receive a signal to/from the control unit 130. For example, in the embodiment of FIG. 4, the current measuring unit 120 may be electrically connected to the control unit 130. In addition, the current measuring unit 120 may output the measured current value of the battery module 10 to the control unit 130.

The control unit 130 may be configured to receive the measured voltage value and the measured current value.

In addition, the control unit 130 may be configured to estimate a SOC (State Of Charge) of the battery module 10 based on the measured voltage value and the measured current value.

For example, the control unit 130 may estimate an initial SOC of the battery module 10 based on a voltage value received from the voltage measuring unit 110 at a time point when the battery module 10 starts being charged. Specifically, the control unit 130 may estimate the initial SOC by referring to a voltage-SOC profile stored in the storage unit 140. Preferably, the voltage value received from the voltage measuring unit 110 at a time point when the battery module 10 starts being charged may be an OCV (Open Circuit Voltage) of the battery module 10.

After estimating the initial SOC, the control unit 130 may estimate a SOC of the battery module 10 by adding up current values received from the current measuring unit 120 during a charging time of the battery module 10 to the initial SOC.

In addition, the control unit 130 may be configured to calculate an accumulated change rate obtained by adding up a change rate of the estimated SOC per unit time.

For example, the change rate of the SOC per unit time may be a change rate of SOC per second. The change rate per unit time will be described with reference to FIGS. 5, 6 and 7.

Figure 5:
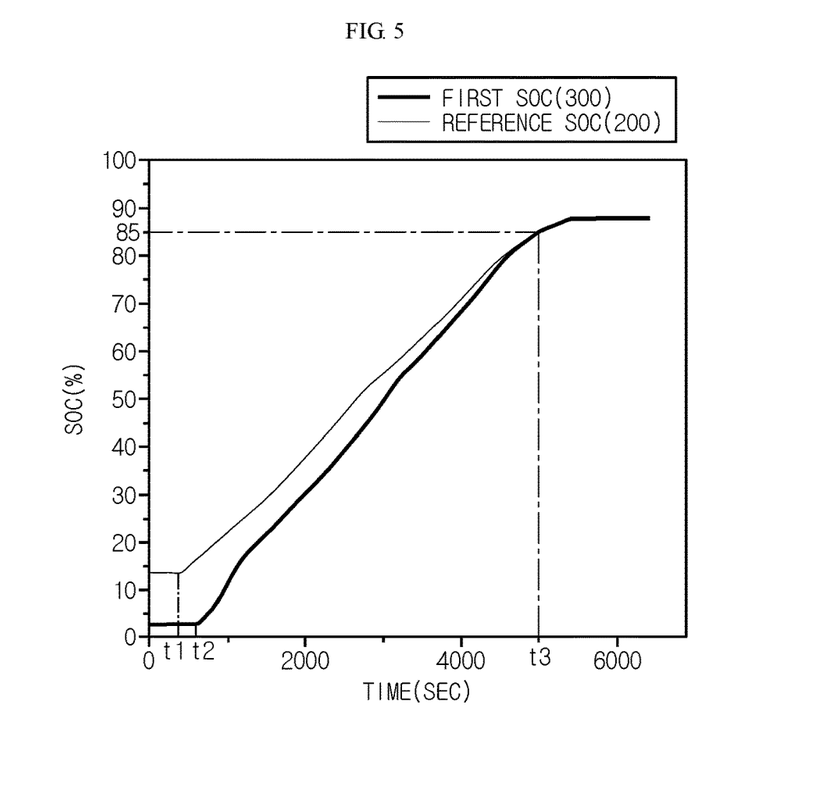
FIG. 5 is a diagram schematically showing a reference SOC for a reference module and a first SOC for the battery module.
Figure 6:
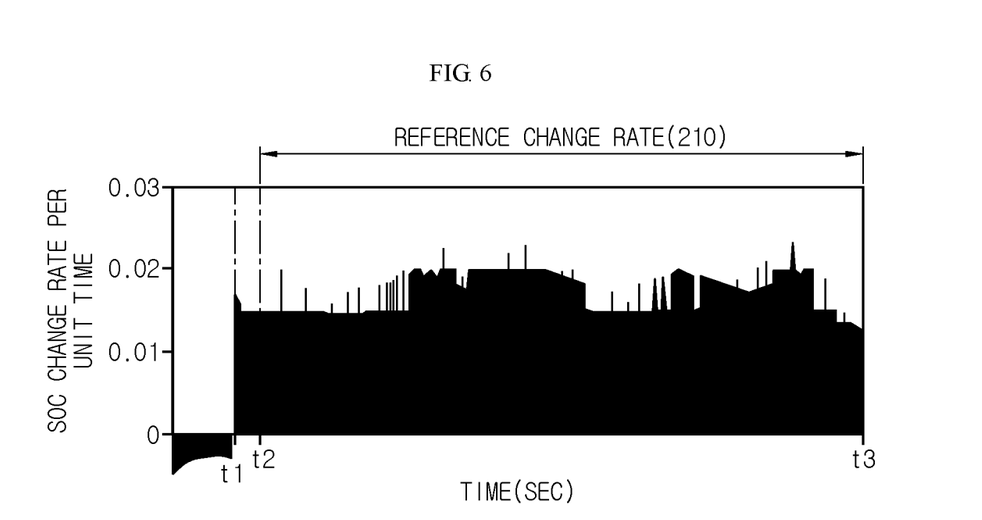
FIG. 6 is a diagram showing a change rate of the reference SOC per unit time.
Figure 7:
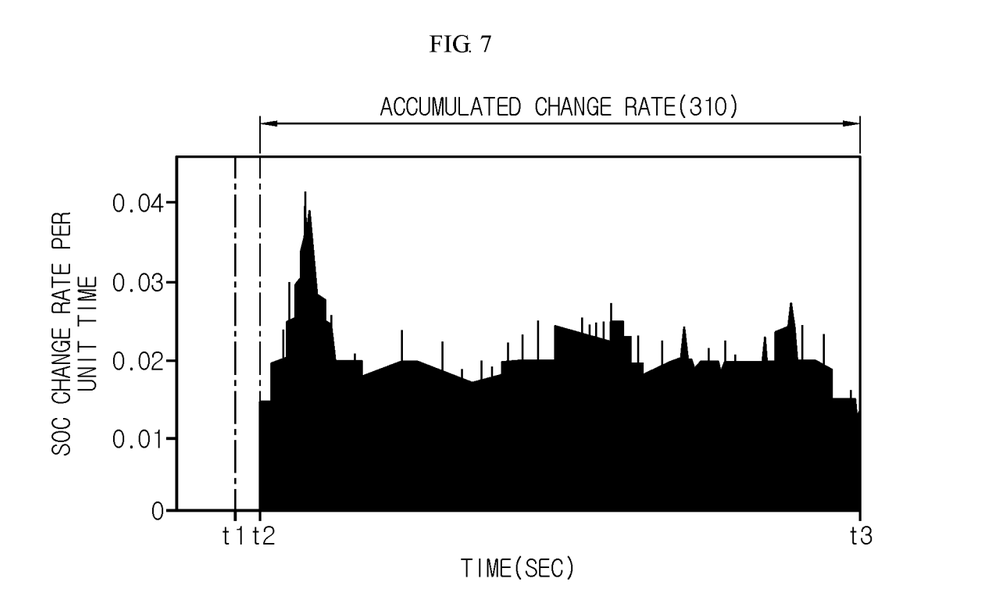
FIG. 7 is a diagram showing a change rate of the first SOC per unit time.

FIG. 5 is a diagram schematically showing a reference SOC 200 for a reference module and a first SOC 300 for the battery module 10. FIG. 6 is a diagram showing a change rate of the reference SOC 200 per unit time. FIG. 7 is a diagram showing a change rate of the first SOC 300 per unit time.

Here, the reference module is a reference module including battery cells in a normal state. Preferably, the number of battery cells included in the reference module may be the same as the number of battery cells included in the battery module 10. In addition, the reference SOC 200 refers to a SOC of the reference module when the reference module is charged with the same charging current as the battery module 10 for the same time. Preferably, information on the reference SOC 200 may be stored in the storage unit 140 in advance. The control unit 130 may obtain the corresponding information by referring to the information on the reference SOC 200 stored in the storage unit 140.

For example, referring to FIGS. 5, 6 and 7, the change rate of the SOC per unit time may be an instantaneous change rate of SOC per second. That is, in the embodiment of FIG. 5, an instantaneous slope of the SOC may correspond to the change rate per unit time.

In addition, the control unit 130 may calculate the accumulated change rate by adding up a change rate of the SOC of the battery module per unit time.

For example, in the embodiment of FIG. 6, the control unit 130 may calculate a reference change rate 210 by adding up the change rate of the reference SOC 200 per unit time for the reference module. In addition, in the embodiment of FIG. 7, the control unit 130 may calculate an accumulated change rate 310 by adding up the change rate of the first SOC 300 per unit time for the battery module 10.

The control unit 130 may be configured to detect whether the battery module 10 has a defect by comparing the calculated accumulated change rate 310 with the reference change rate 210.

Preferably, the control unit 130 may determine that the battery module 10 has a defect if a difference between the calculated accumulated change rate 310 and the reference change rate 210 is greater than or equal to a predetermined error range.

That is, since the reference change rate 210 is calculated based on the reference module in a normal state, the control unit 130 may detect whether the battery module 10 has a defect by obtaining the difference between the reference change rate 210 and the accumulated change rate 310.

For example, in the embodiment of FIG. 3, it is assumed that one battery cell has a defect among the plurality of battery cells B1 to B8 provided in the battery module 10. Since the plurality of battery cells B1 to B8 are connected in parallel in the battery module 10 and the reference module, the SOC of the battery module 10 and the SOC of the reference module may be substantially the same after a time point t3. That is, only by comparing the SOC between the battery module 10 and the reference module near the accumulation end point, it is difficult to clearly detect whether the battery module 10 including the plurality of battery cells B1 to B8 connected in parallel has a defect.

However, when the same charging current is applied to the battery module 10 and the reference module for the same period of time, the SOC of the battery module 10 may increase sharply, compared to the SOC of the reference module. This is because the number of normal cells included in the battery module 10 and the reference module is different, and the plurality of battery cells B1 to B8 are connected in parallel.

Accordingly, the change rate of SOC per unit time may be different between the battery module 10 and the reference module. For this reason, if the accumulated change rate 310 for the battery module 10 is compared with the reference change rate 210 for the reference module, it is possible to clearly detect whether the battery module 10 has a defect, even though it is difficult to detect the same by comparing the SOCs of the battery module 10 and the reference module at the accumulation end point.

Since the battery management apparatus 100 according to an embodiment of the present disclosure compares the accumulated change rate 310 for the battery module 10 with the reference change rate 210 for the reference module, there is an advantage of detecting a defect of the battery module 10 including a plurality of battery cells B1 to B8 connected in parallel.

Meanwhile, the control unit 130 provided to the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 130 may be implemented as a set of program modules. At this time, the program module may be stored in a memory and executed by the control unit 130. The memory may be located inside or out of the control unit 130 and may be connected to the control unit 130 by various well-known means.

In addition, the battery management apparatus 100 may further include a storage unit 140. The storage unit 140 may store programs, data and the like required for the control unit 130 to manage a battery. That is, the storage unit 140 may store data necessary for operation and function of each component of the battery management apparatus 100, data generated in the process of performing the operation or function, or the like. The storage unit 140 is not particularly limited in its kind as long as it is a known information storage means that can record, erase, update and read data. As an example, the information storage means may include RAM, flash memory, ROM, EEPROM, registers, and the like. In addition, the storage unit 140 may store program codes in which processes executable by the control unit 130 are defined.

The control unit 130 may be configured to detect the number of abnormal cells among the plurality of battery cells B1 to B8 included in the battery module 10 by comparing the calculated accumulated change rate 310 with the reference change rate 210.

As shown in FIG. 3, the battery module 10 may include a plurality of battery cells B1 to B8 connected in parallel.

In addition, as described above, if abnormal cells are included in the plurality of battery cells B1 to B8 in the battery module 10, even though the SOC of the battery module 10 and the SOC of the reference module may be the same at the accumulation end point t3, the accumulated change rate 310 for the battery module 10 and the reference change rate 210 for the reference module may be different as much as the number of abnormal cells included in the battery module 10.

For example, in the embodiment of FIG. 3, it is assumed that the first battery cell B1 is an abnormal cell among the plurality of battery cells B1 to B8 included in the battery module 10. In this case, a difference between the accumulated change rate 310 for the battery module 10 and the reference change rate 210 for the reference module may be about 12.5%. As a specific example, if the reference change rate 210 is 50, the accumulated change rate 310 may be 56.25. In this case, the difference between the reference change rate 210 and the accumulated change rate 310 may be 12.5% ((56.25−50)÷50×100%) based on the reference change rate 210. The control unit 130 may detect that one battery cell is an abnormal cell in the battery module 10 based on the calculated difference.

In the embodiment of FIG. 3, it is assumed that the first battery cell B1 and the second battery cell B2 are abnormal cells among the plurality of battery cells B1 to B8 included in the battery module 10. In this case, a difference between the reference change rate 210 for the reference module and the accumulated change rate 310 for the battery module 10 may be 25%. As a specific example, if the reference change rate 210 is 50, the accumulated change rate 310 may be 62.5. In this case, the difference between the reference change rate 210 and the accumulated change rate 310 may be 25% ((62.5−50)÷50×100%) based on the reference change rate 210. The control unit 130 may detect that two battery cells are abnormal cells in the battery module 10 based on the calculated difference.

As such, the battery management apparatus 100 according to an embodiment of the present disclosure may not only detect a defect of the battery module 10 through the difference between the accumulated change rate 310 and the reference change rate 210 but also detect the number of abnormal cells included in the battery module 10. Therefore, the battery management apparatus 100 has an advantage of detecting a defect of the battery module 10 more specifically.

The control unit 130 may be configured to set a detection ratio according to the number of abnormal cells based on the number of the plurality of battery cells B1 to B8.

For example, as in the embodiment of FIG. 3, it is assumed that the number of the plurality of battery cells B1 to B8 included in the battery module 10 is eight. The control unit 130 may set the detection ratio as a ratio of each battery cell in the battery module 10. In this case, the control unit 130 may set the detection ratio to 12.5% (100÷8%).

The control unit 130 may be configured to detect the number of abnormal cells according to a result of comparing the difference between the calculated accumulated change rate 310 and the reference change rate 210 with the detection ratio.

For example, if the difference between the accumulated change rate 310 and the reference change rate 210 is 12.5%, the control unit 130 may detect that the number of abnormal cells included in the battery module 10 is one.

As another example, if the difference between the accumulated change rate 310 and the reference change rate 210 is 25%, the control unit 130 may detect that the number of abnormal cells included in the battery module 10 is two.

The battery management apparatus 100 according to an embodiment of the present disclosure has an advantage of detecting not only a defect in the battery module 10 but also the number of abnormal cells included in the battery module 10. Therefore, the battery management apparatus 100 has an advantage of providing a more detailed and precise defect detection result for the battery module 10.

Preferably, the control unit 130 may be configured to detect the number of abnormal cells according to a value obtained by dividing the difference between the calculated accumulated change rate 310 and the reference change rate 210 by the detection ratio.

For example, as in the former embodiment, it is assumed that eight battery cells are included in the battery module 10, so that the detection ratio is set to 12.5%. If the difference between the calculated accumulated change rate 310 and the reference change rate 210 is 12.7%, the result of dividing 12.7% by 12.5% is 1.016. In this case, the control unit 130 may detect that the battery module 10 includes 1.016 abnormal cells. Preferably, the control unit 130 may determine that the battery module 10 includes at least one abnormal cell.

As another example, when the difference between the calculated accumulated change rate 310 and the reference change rate 210 is 25.3%, the result of dividing 25.3% by 12.5% is 2.024. In this case, the control unit 130 may detect that the battery module 10 includes 2.024 abnormal cells. Preferably, the control unit 130 may determine that the battery module 10 includes at least two abnormal cells.

The battery management apparatus 100 according to an embodiment of the present disclosure has an advantage of more accurately detecting a defect of the battery module 10 by using the detection ratio set to correspond to the number of the plurality of battery cells B1 to B8 included in the battery module 10.

The control unit 130 may be configured to calculate the accumulated change rate 310 by adding up the change rate of the SOC per unit time from an accumulation start point t2 to an accumulation end point t3 during which the estimated SOC changes.

For example, in the embodiment of FIGS. 5 and 7, it may be found that the charging current is introduced to the battery module 10 from 0 second, but the first SOC 300 changes from the time point t2. In this case, the accumulation start point at which the SOC of the battery module 10 starts being changed may be t2.

In addition, the control unit 130 may be configured to determine a time point at which the SOC of the battery module 10 reaches a preset target value as the accumulation end point of the battery module 10.

For example, when the battery cell is completely discharged so that the SOC reaches 0% or when the battery cell is fully charged so that the SOC reaches 100%, the degradation of the battery cell may be rapidly accelerated. Therefore, in general, the operating range of the battery cell may be limited to be narrower than the range of 0% to 100%. Preferably, it may be limited to 3% to 88% SOC of the battery cell.

Therefore, the control unit 130 may set the time point at which the SOC of the battery module 10 reaches the preset target value as the accumulation end point t3 in order to prevent the degradation of the battery module 10 from accelerating in the process of detecting a defect of the battery module 10.

For example, the control unit 130 may set a time point at which the SOC of the battery module 10 reaches 85% as the accumulation end point t3. That is, in the embodiment of FIG. 5, the time point t3 at which the SOC of the battery module 10 reaches 85% may be set as the accumulation end point.

After that, the charging current flowing into the battery module 10 is gradually reduced, so that charging of the battery module 10 may be terminated when the SOC of the battery module 10 is about 88%.

In addition, in the embodiment of FIG. 7, the control unit 130 may calculate the accumulated change rate 310 by adding up the change rate of the first SOC 300 from the time point t2 to the time point t3. That is, the change rate of the first SOC 300 from 0 second to the time point immediately before t2 may be excluded in the process of calculating the accumulated change rate 310.

In addition, the control unit 130 may be configured to set the reference change rate 210 by adding up the change rate of the reference SOC 200 from the accumulation start point t2 to the accumulation end point t3.

Specifically, the control unit 130 may add up the change rate of the reference SOC 200 for the reference module from the accumulation start point t2 to the accumulation end point t3. That is, the control unit 130 may calculate the reference change rate 210 and the accumulated change rate 310 by adding up the change rate of the reference SOC 200 of the reference module and the change rate of the first SOC 300 of the battery module 10 during the same period.

For example, in the embodiments of FIGS. 5 and 6, it may be found that the change rate of the reference SOC 200 changes to a positive change rate from the time point t1. However, the control unit 130 may set the reference change rate 210 by adding up the change rate of the reference SOC 200 from the accumulation start point t2 to the accumulation end point t3.

As described above, in the process of detecting the number of abnormal cells included in the battery module 10, the difference between the reference change rate 210 and the accumulated change rate 310 and the detection ratio are considered. That is, if the calculation conditions of the reference change rate 210 and the accumulated change rate 310 are different from each other, the accuracy and reliability of detection for the number of abnormal cells included in the battery module 10 is inevitably decreased.

Therefore, the battery management apparatus 100 according to an embodiment of the present disclosure may improve accuracy and reliability for detection of a defect of the battery module 10 by matching the conditions for calculating the reference change rate 210 and the accumulated change rate 310.

The control unit 130 may be configured to determine a time point at which the measured voltage value becomes greater than or equal to a reference voltage value as the accumulation start point t2.

Specifically, when the voltage of the battery module 10 is less than the reference voltage value, the control unit 130 may estimate the SOC according to the initial voltage of the battery module 10.

For example, in the embodiment of FIG. 5, it is assumed that the voltage of the battery module 10 reaches the reference voltage value at the time point t2. The SOC of the battery module 10 is identical as about 3% up to the time point t2, but after that, the SOC of the battery module 10 can be estimated by adding up the current value received from the current measuring unit 120.

As described above, when the battery cell is overdischarged, the degradation of the battery cell may be accelerated. In addition, when the battery cell is overdischarged to lower its voltage below a preset lower limit, it may be difficult to accurately estimate the SOC of the battery cell due to the physicochemical action of the battery cell. Accordingly, the control unit 130 may determine the accumulation start point t2 as a starting point of a section in which the SOC of the battery module 10 may be more accurately estimated.

After that, the control unit 130 may calculate the accumulated change rate 310 by adding up the change rate of the first SOC 300 of the battery module 10 from the accumulation start point t2 to the accumulation end point t3. In addition, the control unit 130 may calculate the reference change rate 210 by adding up the change rate of the reference SOC 200 of the reference module from the accumulation start point t2 to the accumulation end point t3.

Therefore, the battery management apparatus 100 according to an embodiment of the present disclosure has an advantage of improving the accuracy of detection of a defect of the battery module 10 by limiting the time range for calculating the accumulated change rate 310 and the reference change rate 210 to a section in which the SOC of the battery module 10 may be accurately estimated.

Hereinafter, an embodiment in which a plurality of battery modules 10a, 10b, 10c are provided in the battery pack 1 will be described with reference to FIG. 8.

Figure 8:
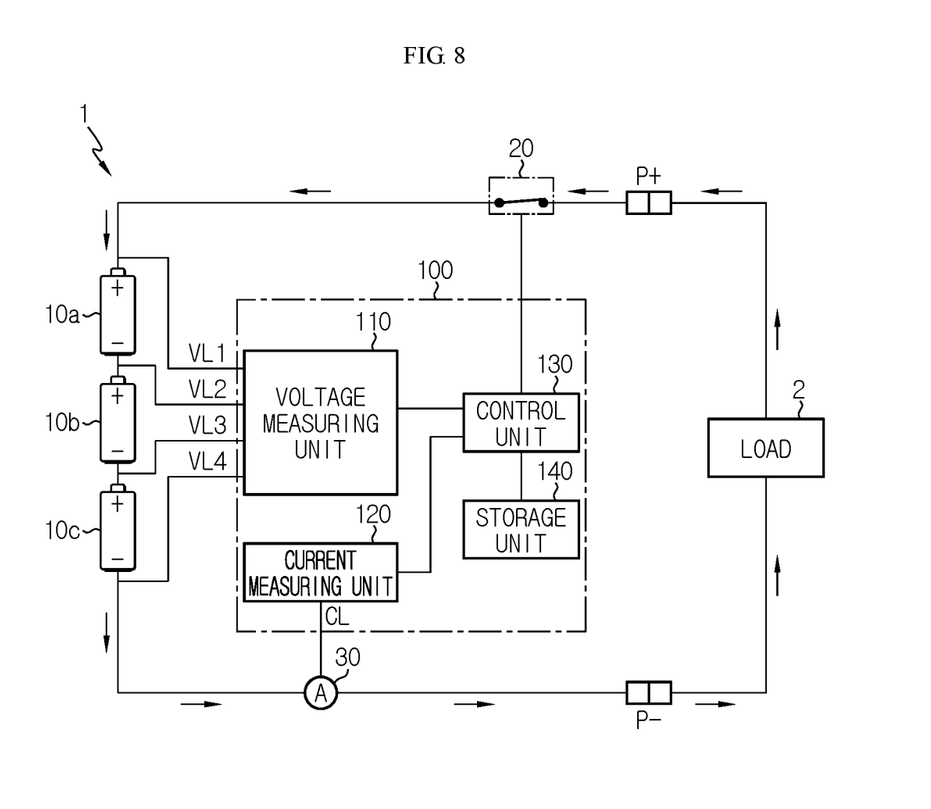
FIG. 8 is a diagram showing another embodiment of the battery pack including the battery management apparatus according to an embodiment of the present disclosure.

FIG. 8 is a diagram showing another embodiment of the battery pack 1 including the battery management apparatus 100 according to an embodiment of the present disclosure.

Referring to FIG. 8, the battery pack 1 may include a plurality of battery modules 10a, 10b, 10c.

Specifically, the battery module 10 including a plurality of battery cells B1 to B8 connected in parallel may be provided in plural.

For example, in the embodiment of FIG. 8, the plurality of battery modules 10a, 10b, 10c may be connected to each other in series. Hereinafter, for convenience of description, it will be described that a first battery module 10a, a second battery module 10b and a third battery module 10c are included in the battery pack 1.

The voltage measuring unit 110 may measure a voltage of each of the first battery module 10a, the second battery module 10b and the third battery module 10c.

For example, in the embodiment of FIG. 8, the voltage measuring unit 110 may measure the voltage of the first battery module 10a through the first voltage sensing line VL1 and the second voltage sensing line VL2. In addition, the voltage measuring unit 110 may measure the voltage of the second battery module 10b through the second voltage sensing line VL2 and a third voltage sensing line VL3. In addition, the voltage measuring unit 110 may measure the voltage of the third battery module 10c through the third voltage sensing line VL3 and a fourth voltage sensing line VL4.

The control unit 130 may be configured to calculate an accumulated change rate for each of the plurality of battery modules 10a, 10b, 10c.

For example, in the embodiment of FIG. 8, a charging current may be introduced from the load 2 connected to the battery pack 1 into the plurality of battery modules 10a, 10b, 10c. In the process of charging the plurality of battery modules 10a, 10b, 10c, the control unit 130 may estimate the SOC of each of the plurality of battery modules 10a, 10b, and 10c based on the voltage value of each of the plurality of battery modules 10a, 10b, 10c measured by the voltage measuring unit 110 and the current value thereof measured by the current measuring unit 120.

Thereafter, the control unit 130 may be configured to compare the accumulated change rate calculated for each of the plurality of battery modules 10a, 10b, 10c with the reference change rate.

Preferably, the control unit 130 may determine a time point at which all SOCs of the plurality of battery modules 10a, 10b, 10c change as the accumulation start point. In addition, a time point at which the SOC of any one of the plurality of battery modules 10a, 10b, 10c reaches the preset target value may be determined as the accumulation end point.

In addition, the control unit 130 may accumulate a change rate of SOC from the accumulation start point to the accumulation end point for each of the reference module, the first battery module 10a, the second battery module 10b and the third battery module 10c. For example, the control unit 130 may calculate a reference change rate for the reference module, a first accumulated change rate for the first battery module 10a, a second accumulated change rate for the second battery module 10b, and a third accumulated change rate for the third battery module 10c.

In addition, the control unit 130 may compare the reference change rate, the first accumulated change rate, the second accumulated change rate and the third accumulated change rate with each other. For example, the control unit 130 may calculate a first change rate difference between the reference change rate and the first accumulated change rate, a second change rate difference between the reference change rate and the second accumulated change rate, and a third change rate difference between the reference change rate and the third accumulated change rate, respectively.

In addition, the control unit 130 may be configured to detect the number of abnormal cells among the plurality of battery cells B1 to B8 included in each of the plurality of battery modules 10*a*, 10*b*, 10*c*.

Specifically, the control unit 130 may detect a defect of the first battery module 10*a* and the number of abnormal cells included in the first battery module 10*a* based on a result of comparing the first change rate difference with a set detection ratio.

Likewise, the control unit 130 may detect a defect of the second battery module 10*b* and the number of abnormal cells included in the second battery module 10*b* based on a result of comparing the second change rate difference with the set detection ratio.

In addition, the control unit 130 may detect a defect of the third battery module 10*c* and the number of abnormal cells included in the third battery module 10*c* based on a result of comparing the third change rate difference with the set detection ratio.

In the process of calculating the reference change rate, the first accumulated change rate, the second accumulated change rate and the third accumulated change rate, the accumulation start point and the accumulation end point may be set identically, so it is possible to defect a defect of each of the plurality of battery modules 10*a*, 10*b*, 10*c* included in the battery pack 1 and the number of abnormal cells included therein under the same conditions.

Accordingly, the battery management apparatus 100 has an advantage of more accurately detecting a defect of each of the plurality of battery modules 10*a*, 10*b*, 10*c* even for the battery pack 1 including a plurality of battery modules 10*a*, 10*b*, 10*c*.

In addition, the battery pack 1 including the battery management apparatus 100 according to an embodiment of the present disclosure may further include electrical equipment (a relay, a fuse, etc.), a case, and the like, in addition to at least one battery module 10, the main relay 20 and the current measuring element 30.

Figure 9:
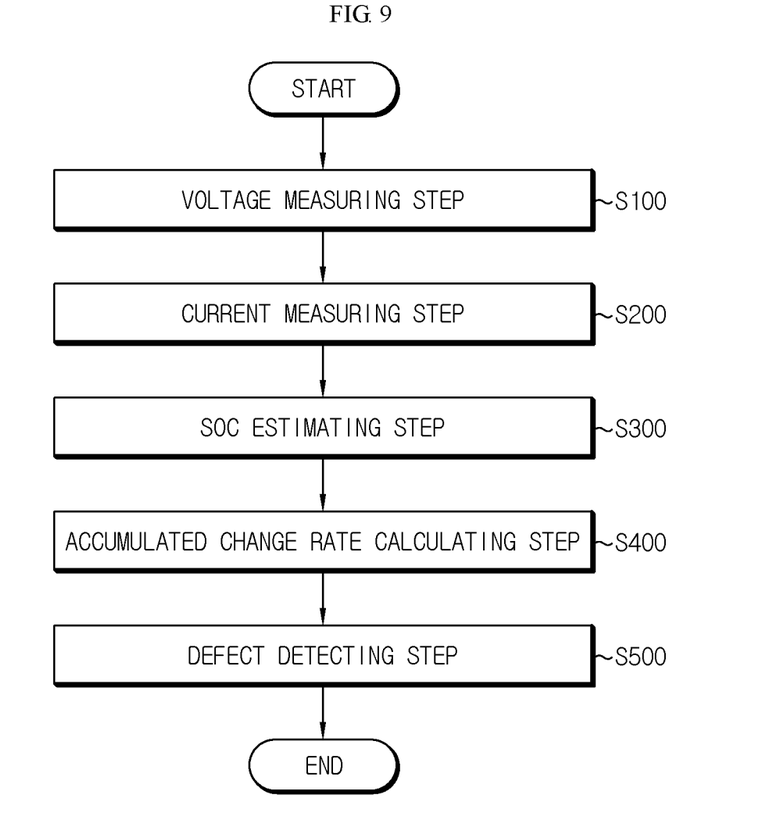
FIG. 9 is a diagram schematically showing a battery management method according to another embodiment of the present disclosure.

FIG. 9 is a diagram schematically showing a battery management method according to another embodiment of the present disclosure.

Referring to FIG. 9, the battery management method according to another embodiment of the present disclosure may include a voltage measuring step (S100), a current measuring step (S200), a SOC estimating step (S300), an accumulated change rate calculating step (S400) and a defect detecting step (S500).

In addition, the battery management method according to another embodiment of the present disclosure may be performed by the battery management apparatus 100 according to an embodiment of the present disclosure.

The voltage measuring step (S100) is a step of measuring a voltage of the battery module 10, and may be performed by the voltage measuring unit 110.

The voltage measuring unit 110 may measure the voltage of the battery module 10 by measuring the voltage at both ends of the battery module 10.

The current measuring step (S200) is a step of measuring a charging current of the battery module 10, and may be performed by the current measuring unit 120.

For example, in the embodiment of FIG. 4, the current measuring element 30 may be disposed on the high current path of the battery pack 1. The current measuring unit 120 may be connected to the current measuring element 30 to measure the current of the battery module 10 through the current measuring element 30. Specifically, the current measuring unit 120 may measure a charging current flowing into the battery module 10.

The SOC estimating step (S300) is a step of estimating a SOC of the battery module 10 based on the measured voltage value and the measured current value, and may be performed by the control unit 130.

First, the control unit 130 may receive the measured voltage value from the voltage measuring unit 110 and receive the measured current value from the current measuring unit 120.

In addition, the control unit 130 may estimate an initial SOC of the battery module 10 based on the received voltage value. After that, the control unit 130 may estimate the SOC of the battery module 10 by adding up the received current value to the estimated initial SOC.

Preferably, the control unit 130 may estimate the SOC of the battery module 10 as the initial SOC at a time point where the voltage value of the battery module 10 is less than the reference voltage value. In addition, the control unit 130 may estimate the SOC of the battery module 10 by adding up the received current value from a time point at which the voltage value of the battery module 10 is equal to or greater than the reference voltage value.

For example, in the embodiment of FIG. 5, the SOC of the reference module may be estimated by adding up a current value from the time point t1. In addition, the SOC of the battery module 10 may be estimated by adding up a current value from the time point t2.

The accumulated change rate calculating step (S400) is a step of calculating an accumulated change rate obtained by adding up the estimated change rate of SOC per unit time, and may be performed by the control unit 130.

Preferably, the control unit 130 may add up the change rate of SOC of the battery module 10 from the accumulation start point at which the SOC of the battery module 10 starts being changed only to the accumulation end point at which the SOC of the battery module 10 reaches the preset target value.

For example, in the embodiment of FIGS. 5 and 7, the accumulation start point may be t2 and the accumulation end point may be t3. The control unit 130 may calculate the accumulated change rate 310 by adding up the change rate of the first SOC 300 of the battery module 10 from the accumulation start point t2 to the accumulation end point t3.

In addition, in the embodiment of FIGS. 5 and 6, the control unit 130 may calculate the reference change rate 210 by adding up the change rate of the reference SOC 200 of the reference module from the accumulation start point t2 to the accumulation end point t3.

The defect detecting step (S500) is a step of detecting whether the battery module 10 has a defect by comparing the calculated accumulated change rate 310 with the reference change rate 210, and may be performed by the control unit 130.

Preferably, the control unit 130 may detect whether the battery module 10 has a defect through the difference between the calculated accumulated change rate 310 and the reference change rate 210. More preferably, the control unit 130 may detect a defect of the battery module 10 and the number of abnormal cells included in the battery module 10 according to the result of comparing the difference between the calculated accumulated change rate 310 and the reference change rate 210 with the detection ratio.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
2: load
10: battery module
20: main relay
30: current measuring element
100: battery management apparatus
110: voltage measuring unit
120: current measuring unit
130: control unit
140: storage unit

What is claimed is:

1. A battery management apparatus, comprising:
a voltage measurer configured to measure a voltage of a battery module and output a measured voltage value;
a current measurer configured to measure a charging current of the battery module and output a measured current value; and
a controller configured to:
be electrically connected to the voltage measurer and the current measurer, receive the measured voltage value from the voltage measurer,
receive the measured current value from the current measurer,
estimate a state of charge (SOC) of the battery module based on the measured voltage value and the measured current value,
calculate an accumulated change rate by adding up a change rate per unit time of the estimated SOC,
detect whether the battery module has a defect by comparing the calculated accumulated change rate with a reference change rate,
calculate the accumulated change rate by summing the change rate per unit time of the SOC from an accumulation start point to an accumulation end point, and
set the reference change rate by summing a change rate per unit time of a reference SOC from the accumulation start point to the accumulation end point,
wherein the controller is configured to detect a number of abnormal cells among a plurality of battery cells included in the battery module by comparing the calculated accumulated change rate with the reference change rate, and wherein the plurality of battery cells is connected in parallel.

2. The battery management apparatus according to claim 1,
wherein the controller is configured to:
set a detection ratio according to the number of abnormal cells, based on a number of the plurality of battery cells, and
detect the number of abnormal cells according to a result of comparing a difference between the calculated accumulated change rate and the reference change rate with the detection ratio.

3. The battery management apparatus according to claim 2,
wherein the controller is configured to detect the number of abnormal cells according to a value obtained by dividing the difference between the calculated accumulated change rate and the reference change rate by the detection ratio.

4. The battery management apparatus according to claim 1,
wherein the controller is configured to:
calculate the accumulated change rate from the accumulation start point to the accumulation end point during which the estimated SOC changes, and
set the reference change rate from the accumulation start point to the accumulation end point.

5. The battery management apparatus according to claim 1,
wherein the controller is configured to determine a time point at which the measured voltage value becomes equal to or greater than a reference voltage value as the accumulation start point.

6. The battery management apparatus according to claim 1,
wherein the controller is configured to determine a time point at which the SOC of the battery module reaches a preset target value as the accumulation end point of the battery module.

7. The battery management apparatus according to claim 1, wherein the battery module is among a plurality of battery modules of the battery management device,
wherein each of the battery modules includes a plurality of battery cells connected in parallel, and
wherein the controller is configured to:
calculate an accumulated change rate of each of the plurality of battery modules, and
detect a number of abnormal cells among the plurality of battery cells included in each of the plurality of battery modules by comparing the accumulated change rate calculated for each of the plurality of battery modules with the reference change rate.

8. A battery pack, comprising the battery management apparatus according to claim 1.

9. A battery management method, comprising:
a voltage measuring step of measuring, by a voltage measurer of a battery management apparatus, a voltage of a battery module;
a current measuring step of measuring, by a current measurer of the battery management apparatus, a charging current of the battery module;
a state of charge (SOC) estimating step of estimating, by a controller of the battery management apparatus, a SOC of the battery module based on the measured voltage value and the measured current value;

an accumulated change rate calculating step of calculating, by the controller, an accumulated change rate by adding up a change rate per unit time of the estimated SOC;
a defect detecting step of detecting, by the controller, whether the battery module has a defect by comparing the calculated accumulated change rate with a reference change rate,
wherein the controller of the battery management apparatus is electrically connected to the voltage measurer and the current measurer,
wherein the accumulated change rate is calculated by summing the change rate per unit time of the SOC from an accumulation start point to an accumulation end point,
wherein the reference change rate is set by summing a change rate per unit time of a reference SOC from the accumulation start point to the accumulation end point; and
detecting, by the controller, a number of abnormal cells among a plurality of battery cells included in the battery module by comparing the calculated accumulated change rate with the reference change rate, and
wherein the plurality of battery cells is connected in parallel.

* * * * *